United States Patent
Jen et al.

(10) Patent No.: US 11,791,292 B1
(45) Date of Patent: Oct. 17, 2023

(54) EMBEDDED TOUCH PANEL DISPLAY DEVICE

(71) Applicants: INTERFACE TECHNOLOGY (CHENGDU) CO., LTD., Chengdu (CN); INTERFACE OPTOELECTRONICS (SHENZHEN) CO., LTD., Shenzhen (CN); INTERFACE OPTOELECTRONICS (WUXI) CO., LTD., Wu Xi (CN); GENERAL INTERFACE SOLUTION LIMITED, Zhunan Township (TW)

(72) Inventors: Chen Ming Jen, Shenzhen (CN); Pei Hsun Wu, Shenzhen (CN); Hung Chien Lee, Shenzhen (CN); Yen Heng Huang, Shenzhen (CN)

(73) Assignees: Interface Technology (Chengdu) Co., Ltd., Chengdu (CN); Interface Optoelectronics (Shenzhen) Co., Ltd., Shenzhen (CN); Interface Optoelectronics (Wuxi) Co., Ltd., Wu Xi (CN); General Interface Solution Limited, Miaoli County, Zhunan Township (TW)

( * ) Notice: Subject to any disclaimer, the term of this patent is extended or adjusted under 35 U.S.C. 154(b) by 0 days.

(21) Appl. No.: 17/741,916

(22) Filed: May 11, 2022

(30) Foreign Application Priority Data

Mar. 31, 2022 (CN) .......................... 202210332634.1

(51) Int. Cl.
*H01L 23/60* (2006.01)
*G02F 1/1333* (2006.01)
(Continued)

(52) U.S. Cl.
CPC .......... *H01L 23/60* (2013.01); *G02F 1/13338* (2013.01); *G02F 1/133314* (2021.01);
(Continued)

(58) Field of Classification Search
CPC .......................... G02F 1/13338; G06F 3/0412
(Continued)

(56) References Cited

U.S. PATENT DOCUMENTS

| | | | |
|---|---|---|---|
| 2012/0087065 A1* | 4/2012 | Kim ....................... | H04B 15/02 361/679.01 |
| 2020/0133052 A1* | 4/2020 | Gu ........................ | G02F 1/1339 |
| 2020/0272001 A1* | 8/2020 | Kameda ............. | G02F 1/13338 |

* cited by examiner

*Primary Examiner* — Charles S Chang
(74) *Attorney, Agent, or Firm* — Rosenberg, Klein & Lee (57) ABSTRACT

An embedded touch panel display device includes: a display unit having a display surface and a non-display surface opposite to the display surface; a touch-control unit disposed inside the display unit; a conductive frame disposed on one side of the display unit and facing the non-display surface thereof; an insulating ink and a first conductive ink disposed on at least one sidewall of the display unit and extended to the non-display surface, in which the first conductive ink overlaps the insulating ink; and a double-sided adhesive disposed between the display unit and the conductive frame to secure them. The first conductive ink and the conductive frame are electrically connected to each other to form an electrostatic discharge path. The present invention can prevent the peripheral area of the viewed area from a blackening phenomenon induced by excessively high electrostatic voltage.

15 Claims, 5 Drawing Sheets

(51) Int. Cl.
 *G06F 3/041* (2006.01)
 *H01L 25/075* (2006.01)
(52) U.S. Cl.
 CPC ...... *G06F 3/0412* (2013.01); *G02F 2201/503* (2013.01); *H01L 25/075* (2013.01)
(58) Field of Classification Search
 USPC .................................................. 349/40, 192
 See application file for complete search history.

EMBEDDED TOUCH PANEL DISPLAY DEVICE

CROSS-REFERENCE TO RELATED APPLICATION

This application claims the priority benefit of China application serial no. 202210332634.1, filed on Mar. 31, 2022. The entirety of the above-mentioned patent application is hereby incorporated by reference herein and made a part of this specification.

BACKGROUND OF THE INVENTION

Field of the Invention

The present invention relates to a display technology, particularly to an embedded touch panel display device.

Description of the Prior Art

With maturity of the display technology and the touch-control technology, the display device integrated with a touch-control device has been the mainstream of the market. The touch-control display devices may be classified into the add-on type and the embedded type. In the touch-control LCD devices, the touch-control panel is disposed on the liquid crystal module (LCM) for the add-on type; the touch-control panel is disposed inside LCM for the embedded type. In comparison with the add-on type touch-control display devices, the embedded type touch-control display devices have the advantages of low thickness and simple fabrication process. Therefore, the display device manufacturers are devoted to the research and development of the embedded type touch-control display devices.

The requirements to touch-control display devices are growing stricter so as to confront more and more diversified and complicated application environment. One of the requirements is the electrostatic charge resistance. Human electrostatic charges and machine electrostatic charges existing in the environment may damage electronic products. The Solid State Technology Association, also known as JEDEC, has established the human body model (HBM) electrostatic discharge test and the machine model (MM) electrostatic discharge test to standardize the effect of electrostatic discharge (ESD) on electronic products.

In LCD devices, an anti-electrostatic layer formed between the polarization film and the protection film can effectively inhibit generation of electrostatic charges and thus can decrease the affection of electrostatic charges on LCD devices. However, while electrostatic charges passes through the housing from the sidewall of the display device, a portion of electrostatic charges may directly flow to and accumulate on the interior circuit, which may cause the malfunction or damage of the interior circuit. Although the existing technology has established electrostatic discharge circuits in the interior circuit, the existing technology can only protect the interior circuit against an electrostatic voltage of 2 kV. In other words, while the electrostatic voltage is over 2 kV, the accumulating electrostatic charges are likely to impair the operation of the display device. For example, while the electrostatic charges accumulate on the thin-film-transistor (TFT) layer of the LCD device, the scanning electrodes may turn on abnormally; as result, the corresponding liquid crystal layer is unable to twist and the light coming from the backlight module fails to pass the polarization film. Eventually, a screen blackening phenomenon occurs in the perimeter of the viewed area of the display device.

Therefore, the display device manufacturers are dedicated to design a superior electrostatic discharge structure so as to avoid abnormal operation and increase the service life of products.

SUMMARY OF THE INVENTION

One objective of the present invention is to enhance the electrostatic discharge (ESD) protection ability of the peripheral area and sidewall of the display unit of a touch-control display device.

In order to achieve the abovementioned objective, the present invention provides an embedded touch panel display device comprising: a display unit, having a display surface and a non-display surface opposite to the display surface; a touch-control unit, disposed inside the display unit; a conductive frame disposed on one side of the display unit and facing the non-display surface of the display unit; an insulating ink disposed on at least one sidewall of the display unit and extended to the non-display surface; a first conductive ink disposed on the at least one sidewall of the display unit and extended to the non-display surface, wherein at least a portion of the first conductive ink is disposed on the insulating ink; and a double-sided adhesive, disposed between the display unit and the conductive frame to secure the display unit and the conductive frame, wherein the first conductive ink and the conductive frame are electrically connected to each other to form an electrostatic discharge path.

In some embodiments, the insulating ink is disposed on at least one sidewall of the display unit and extended to a level equal to or lower than a level of the touch-control unit.

In some embodiments, the first conductive ink is disposed on at least one sidewall of the display unit and extended to a level higher than a level of the touch-control unit.

In some embodiments, a bare portion of the touch-control unit is revealed by the display unit, and at least one of the first conductive ink and the insulating ink is extended to the bare portion of the touch-control unit.

In some embodiments, a bare portion of the display unit is revealed by the touch-control unit, and at least one of the first conductive ink and the insulating ink is extended to the bare portion of the display unit.

In some embodiments, the embedded touch panel display device comprises a second conductive ink disposed on at least one sidewall of the display unit, wherein a bare portion of the touch-control unit is revealed by the display unit, and the second conductive ink is extended to the bare portion of the touch-control unit.

DETAILED DESCRIPTION OF THE INVENTION

The following text and the related drawings further demonstrate the embodiments of the present invention. The identical symbol designate the similar or identical component in the specification and drawings as far as possible. In the drawings, the shapes and thicknesses may be exaggerated for simplicity and convenience. It should be understood: the elements, which belong to the conventional technology and are well known by a person having ordinary knowledge in the art, are not necessarily shown in the drawings or described in the specification. It should be understood also: a person skilled in the art would be able to modify or vary the embodiments of the present invention without departing from the spirit of the present invention.

Some terms may be used to refer to some specified elements in the specification and claims. However, it should be understood by the persons having ordinary knowledge in the art: another term may also be used to refer to the same element. In the specification and claims, the elements are not distinguished by the names thereof but by the functions thereof. The terms "comprise" and "include" mentioned in the specification and claims are open terms and should be interpreted as "contain something and may further contain other things". The term "connect" involves any direct and indirect connecting means. Therefore, if "a first element is connected with a second element" appears in the text, it means that the first element may be connected with the second element in a direct signal connection method, such as an electric connection method, a wireless transmission method or an optical transmission method, or that the first element may be connected with the second element in an indirect signal connection method through another element or another connection means, such as an indirect electric or signal connection method.

Hereinafter, a description about "an embodiment" or "one embodiment" may be involved in a specified element, structure or characteristics of at least one embodiment. Therefore, the descriptions about "an embodiment" or "one embodiment" appearing in several positions of the text do not necessarily refer to the same embodiment. Besides, specified elements, structures or characteristics in one or more embodiments may be combined in an appropriate way.

It should be particularly explained: some conditional clauses or words, such as "can", "could", "might" and "may", normally intend to express that the embodiment of the present invention has but is not limited to have a characteristics, element or step and that the characteristics, element or step is not necessarily indispensable in other embodiments.

Figure 1:
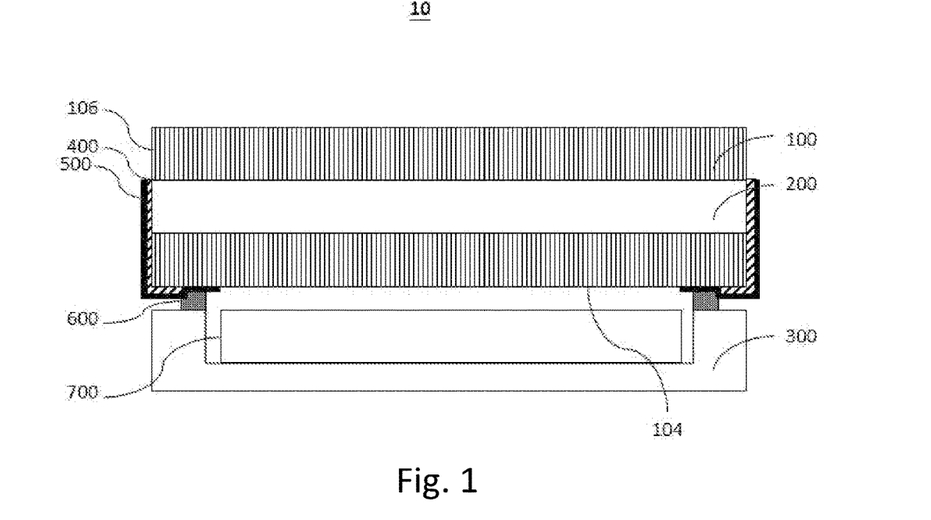
FIG. 1 schematically shows an embedded touch panel display device according to one embodiment of the present invention.
Figure 2:
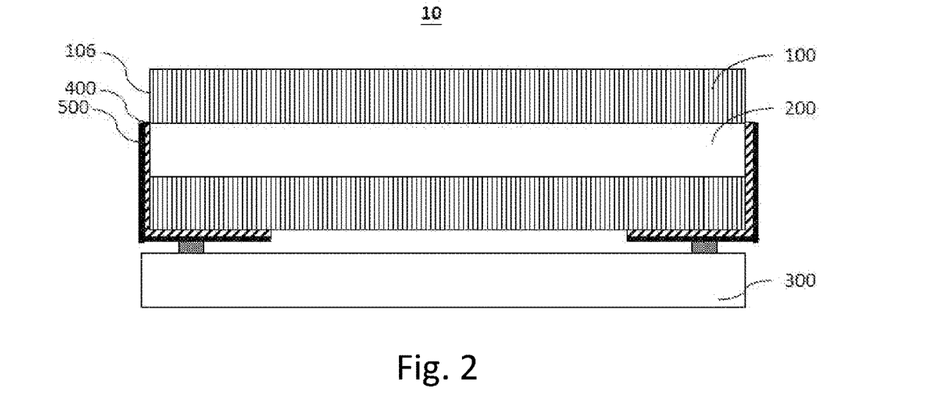
FIG. 2 schematically shows a Micro LED-based display unit according to one embodiment of the present invention.

Refer to FIG. 1. FIG. 1 schematically shows an embedded touch panel display device according to one embodiment of the present invention. The embedded touch panel display device 10 includes a display unit 100, a touch-control unit 200, a conductive frame 300, an insulating ink 400, a first conductive ink 500, and a double-sided adhesive 600. The touch-control unit 200 is embedded inside the display unit 100. The touch panel display device 10 may be but is not limited to be partially or entirely in form of a plane, an arc, or a curved surface. The display unit 100 has a display surface 102 and a non-display surface 104. The insulating ink 400 is disposed on at least one sidewall 106 of the display unit 100 and extended to the non-display surface 104 of the display unit 100. The first conductive ink 500 is disposed on at least one sidewall 106 of the display unit 100 and extended to the non-display surface 104 of the display unit 100. At least a portion of the first conductive ink 500 is disposed on the insulating ink 400. The conductive frame 300 is disposed on one side of the display unit 100 and facing the non-display surface 104 of the display unit 100. The double-sided adhesive 600 is disposed between the non-display surface 104 and the conductive frame 300 to secure the relative position of the display unit 100 and the conductive frame 300. The first conductive ink 500 and the conductive frame 300 are electrically connected to each other to form an electrostatic discharge path. The present invention does not limit the type of the display unit 100. The display unit 100 may be an LCD display device, a mini-LED display device, a micro LED display device, an OLED display device, or another type of display device. The personnel of the industry may adopt one of the abovementioned display units according to requirement. In some exemplary embodiments, an LCD display device is used as the display unit 100, such that a backlight module 700 is disposed between the conductive frame 300 and the display unit 100, as shown in FIG. 1. In some embodiments, a micro LED display device is used as the display unit 100, such that the backlight module 700 is omitted to slim the touch panel display device 10, as shown in FIG. 2.

In some exemplary embodiments, the insulating ink 400 may be made of a carbon-containing material, whereby the insulating ink disposed on the display unit 100 is favorable to prevent from that light leakage occurs in the sidewalls of the display unit 100. In some embodiments, the conductive ink is a transparent liquid including resin and having electric conductivity, whereby the conductive ink can be cured by applying ultraviolet light or thermal curing. The conductive ink may be further extended to a region of the non-display surface 104 corresponding to the viewed area of the display surface, whereby more electrostatic charges can be discharged. In some embodiments, the conductive ink has a sheet resistance less than 500, an optical density greater than 4, a thickness greater than 5 um (preferably, a thickness of 15, 17, or 20 um), a surface tension coefficient greater than 38 dyne/cm, and an adhesion greater than classification 4B (in accordance with ASTM D3359, ISO2409-1992, or GB/T9286-98). The insulating ink 400 and the conductive ink, adopted by the present invention, may be applied on the touch panel display device 10 via various appropriate methods. The abovementioned inks may be applied with a printing method, such as the screen printing method, the ink inject printing method, the flexography method, the gravure printing method, the lithographic printing method, the air brush method, the aerosol printing method, the typesetting method, the stamping method, or another method.

Figure 3:
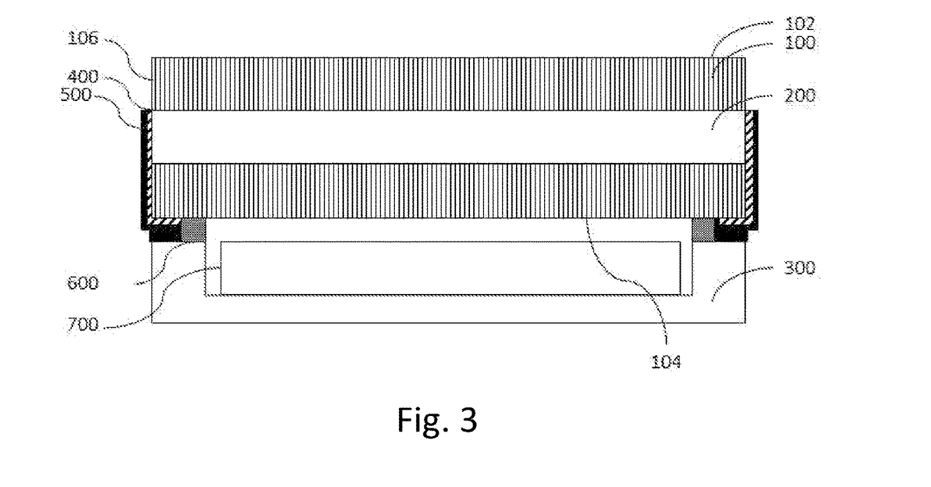
FIGS. 3-13 schematically show embedded touch panel display devices respectively according to a plurality of embodiments of the present invention.

In some embodiments, a conductive double-sided adhesive is used as the double-sided adhesive 600. A portion of the double-sided adhesive 600 neighboring the touch panel display device 10 is disposed on the first conductive ink 500 extended to the non-display surface 104, and another portion thereof is directly disposed on the non-display surface 104. Alternatively, the double-sided adhesive 600 neighboring the touch panel display device 10 is completely disposed on the first conductive ink 500 extended to the non-display surface 104, as shown in FIG. 1. Naturally, the first conductive ink 500 extended to the non-display surface 104 may be disposed on the insulating ink 400, as shown in FIG. 2. With any of the abovementioned configurations, an electrostatic discharge path is formed by the first conductive ink 500, the double-sided adhesive 600, and the conductive frame 300. In some exemplary embodiments, the double-sided adhesive 600 is directly disposed on the non-display surface 104 of the display unit 100, and the first conductive ink 500 is directly extended to the conductive frame 300 to form the electrostatic discharge path, as shown in FIG. 3. In the abovementioned configuration, the double-sided adhesive 600 may be made of an insulating material or a conductive material.

In the present invention, the embedded touch panel display device 10, also called embedded touch-control display device, may be an In-Cell type display device or an On-Cell type display device. The main difference between the In-Cell type display device and the On-Cell type display device is the relative position between the touch-control unit and the display unit. In an LCD device, the common display unit has a lower polarization film, a lower glass substrate, a lower transparent electrode layer, a liquid crystal layer, an upper transparent electrode layer, a color filter, an upper glass substrate, and an upper polarization film, which are arranged in sequence along the light output direction of the backlight module. In the In-Cell type display device, the touch-control unit is disposed between the lower polarization film and the color filter, e.g., between the liquid crystal layer and the color filter, or between the lower polarization film and the liquid crystal layer. In the On-Cell type display device, the touch-control unit is disposed between the color filter and the upper polarization film.

Refer to FIG. 1 again. In some exemplary embodiments, corresponding to the level of the touch-control unit 200 in the display unit 100, the insulating ink 400 disposed on the sidewall 106 is extended to a level equal to or lower than the level of the touch-control unit 200. The abovementioned configuration can effectively decrease the accumulation of the electrostatic charges passing through the housing. For example, in the abovementioned On-Cell type LCD device, since the touch-control unit 200 is disposed between the color filter and the upper polarization film (not shown in the drawings) and the touch-control unit 200 is located above the lower transparent electrode layer, the insulating ink 400, disposed on the sidewall 106 and extended to a level equal to or lower than the level of the touch-control unit 200, covers the lower transparent electrode layer of the display unit 100. In other words, the electrostatic charges are unlikely directly penetrate the housing to accumulate in the perimeter of the lower transparent electrode layer. In the In-Cell type LCD device, if the touch-control unit 200 is disposed between the liquid crystal layer and the color filter, the electrostatic charges are unlikely to directly penetrate the housing to accumulate in the perimeter of the lower transparent electrode layer, either; if the touch-control unit 200 is disposed between the lower polarization film and the liquid crystal layer, the configuration can still decrease the accumulation of the electrostatic charges penetrating the housing from the external bottom of the touch panel display device 10.

Figure 4:
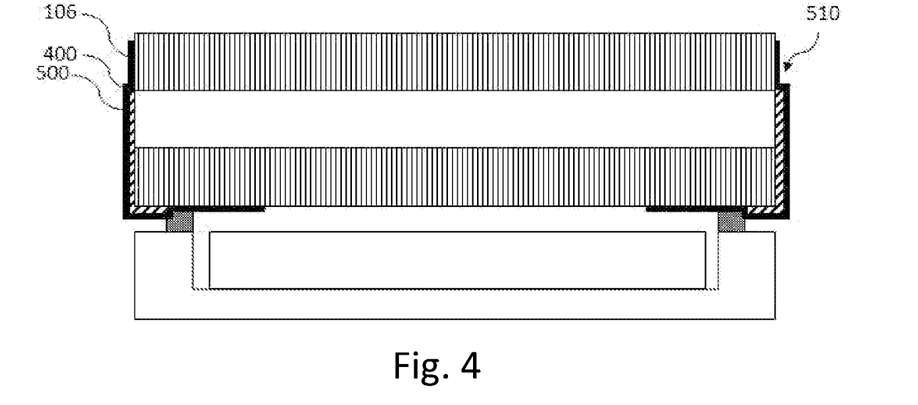
Figure 5:
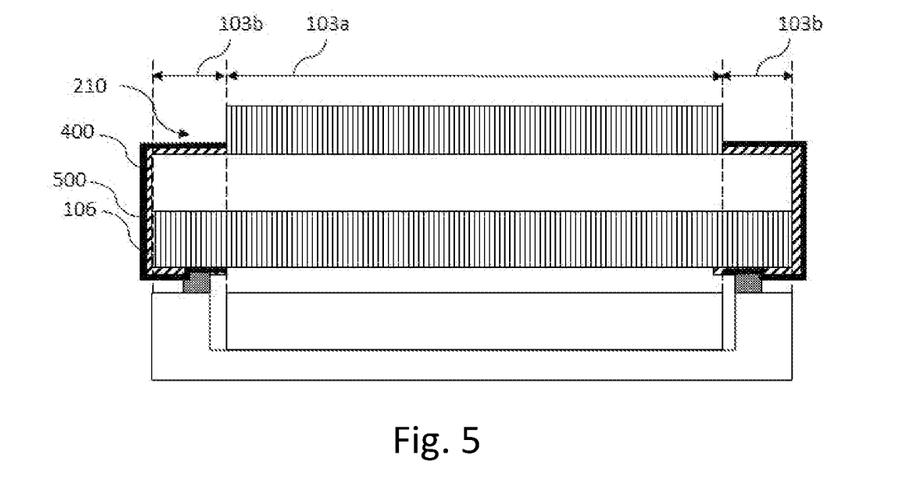
Figure 6:
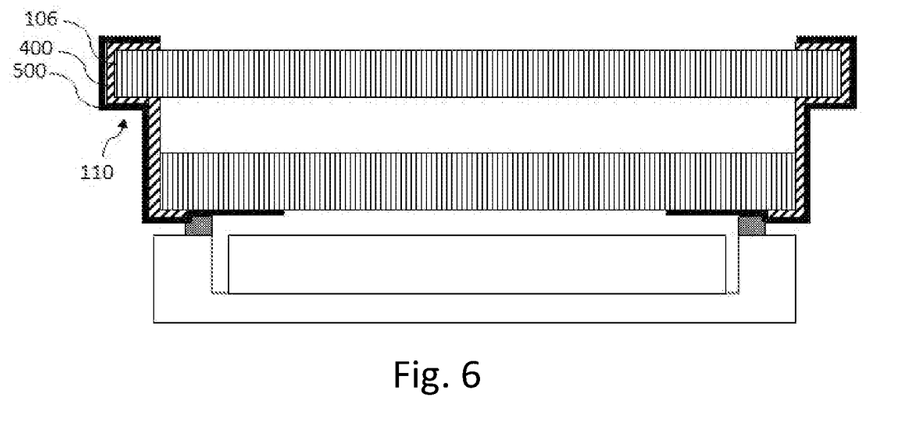

Refer to FIG. 4. In some exemplary embodiments, the first conductive ink 500 disposed on the sidewall 106 is further extended to a level higher than the level of the touch-control unit 200. The configuration not only increases the coverage of the electrostatic discharge path but also provides another electrostatic discharge path passing through the touch-control unit 200, for the touch panel display device 10. The projected capacitive touch-control device includes mainly a glass substrate, transparent conductive films, adhesion layers, protection layers and a glass cover plate, which are stacked in sequence. To slim the device, the transparent conductive films used to detect the X and Y coordinates are normally arranged on the same side; alternatively, either Glass-Film-Film (GFF) technology or the One Glass Solution (OGS) technology is adoptable. In the embedded touch panel display device 10, since the touch-control unit 200 is arranged inside the display unit 100, the glass substrate of the touch-control unit 200 is normally omitted to slim the device. In other words, since the transparent conductive film of the touch-control unit 200 has higher electric conductivity, the first conductive ink (indicated by the numeral 510) disposed on the display unit 100 and being higher than the level of the touch-control unit 200 can cooperate with the neighboring transparent conductive film of the touch-control unit 200 to form another electrostatic discharge path, which is different from the electrostatic discharge path going to the conductive frame 300. The abovementioned transparent conductive film may be but is not limited to be made of a material selected from a group including indium tin oxide (ITO), metal meshes, silver nanowires, carbon nanotubes, transparent conductive inks, and graphene. Refer to FIG. 5. In some exemplary embodiments, a bare portion of the touch-control unit 200 is revealed by the display unit 100, and at least one of the first conductive ink 500 and the insulating ink 400 is extended to the bare portion 210 of the touch-control unit 200. The display unit 100 generally has a viewed area 103a and a peripheral area 103b. The peripheral area 103b, which functions as the bus lines, surrounds the viewed area 103a. Suppose that the first conductive ink 500 is made of graphene or a carbon-containing material and thus has low brightness, while the user views the display unit 100 from the side of the display surface 102, the first conductive ink 500 can further improve the problem that light leaks from the non-viewed areas, such as the sidewall 106 and the peripheral area 103b. If only the first conductive ink 500 is extended to the abovementioned bare portion, the touch-control unit 200 can more effectively discharge the accumulating charges. The perimeter of the touch-control unit 200 generally has peripheral circuits disposed thereon. Therefore, the first conductive ink 500 disposed on the bare portion 210 is relatively close to the transparent film, and the function of the electrostatic discharge path passing through the touch-control unit 200 is enhanced. Refer to FIG. 6. In some embodiments, a bare portion of the display unit 100 is revealed by the touch-control unit 200, and at least one of the first conductive ink 500 and the insulating ink 400 is extended to the bare portion 110 of the display unit 100.

Figure 7:
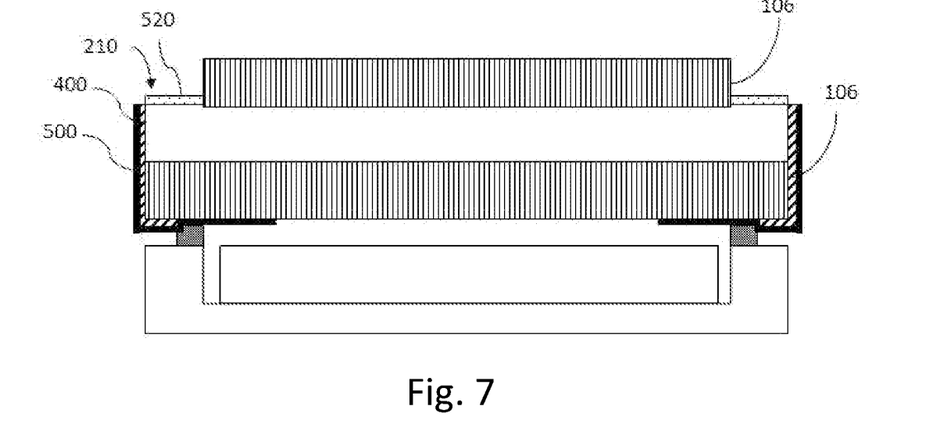
Figure 8:
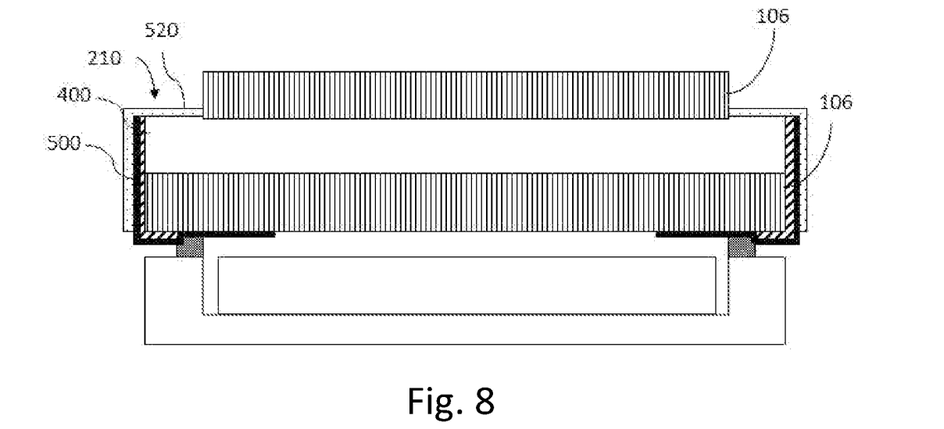
Figure 9:
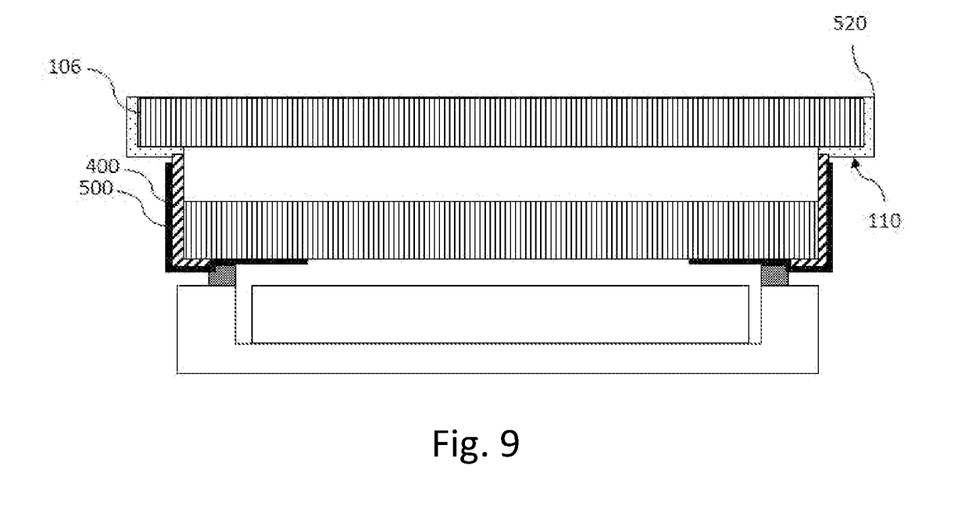
Figure 10:
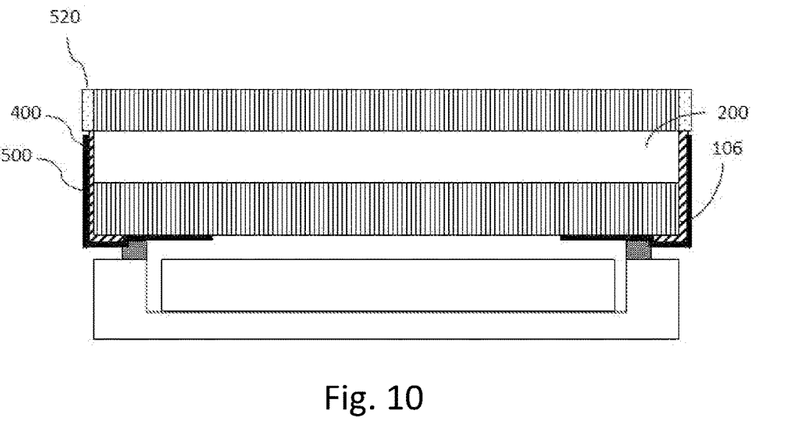
Figure 11:
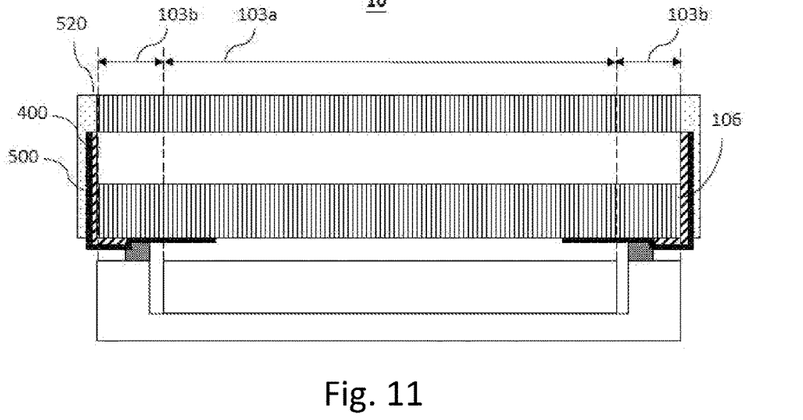

Refer to FIG. 7. In some embodiments, a second conductive ink 520 is disposed on the sidewall 106 of the display unit 100, and the second conductive ink 520 is extended to the bare portion 210 of the touch-control unit 200. The second conductive ink 520 may be a structure independent from the first conductive ink 500, not electrically connected with the first conductive ink 500. Refer to FIG. 8. Alternatively, the second conductive ink 520 is extended to the first conductive ink 500 and disposed on the first conductive ink 500 to electrically connect with the first conductive ink 500. Refer to FIG. 9. In some embodiments, while the display unit 100 is partially revealed by the touch-control unit 200, the second conductive ink 520 may be extended to the bare portion 110 of the display unit 100. Refer to FIG. 10. In some embodiments, the second conductive ink 520 is disposed on the sidewall 106 of the display unit 100, and the region where the second conductive ink 520 is disposed is higher than the level of the touch-control unit 200. In such a case, since the second conductive ink 520 is not electrically connected with the first conductive ink 500, the second conductive ink 520 will discharge the charges accumulating on the upper region of the touch panel display device 10 to the touch-control unit 200, which is a path different from the path along which the first conductive ink 500 discharges the electrostatic charges. While the accumulating electrostatic charges exceed the limit allowed by the electrostatic discharge path of the first conductive ink 500, the second conductive ink 520 can prevent more electrostatic charges from accumulating on the same electrostatic discharge path. Refer to FIG. 11. In some embodiments, the second conductive ink 520 may be further extended downward to the region where the first conductive ink 500 is disposed. In such a case, since the second conductive ink 520 is electrically connected with the first conductive ink 500, the second conductive ink 520 can discharge the charges accumulating on the upper region of the touch panel display device 10 to the electrostatic discharge path of the touch-control unit 200 and the first conductive ink 500. While an excessive amount of electrostatic charges accumulate on the second conductive ink 520, the abovementioned configuration can prevent the touch-control unit 200 from being adversely affected.

Figure 12:
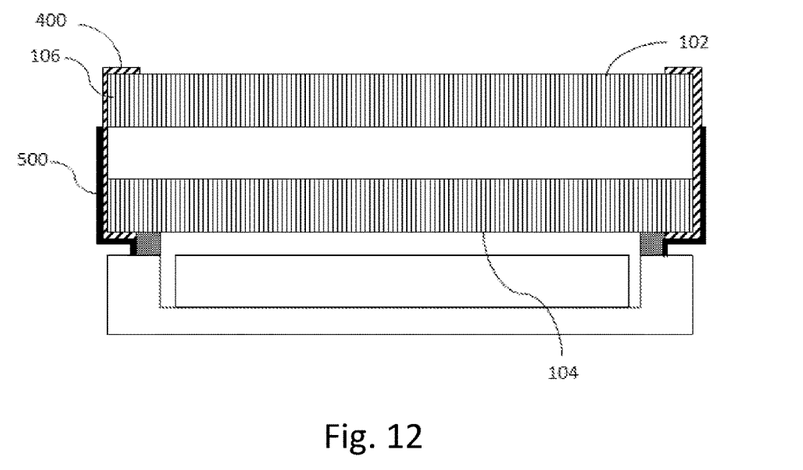
Figure 13:
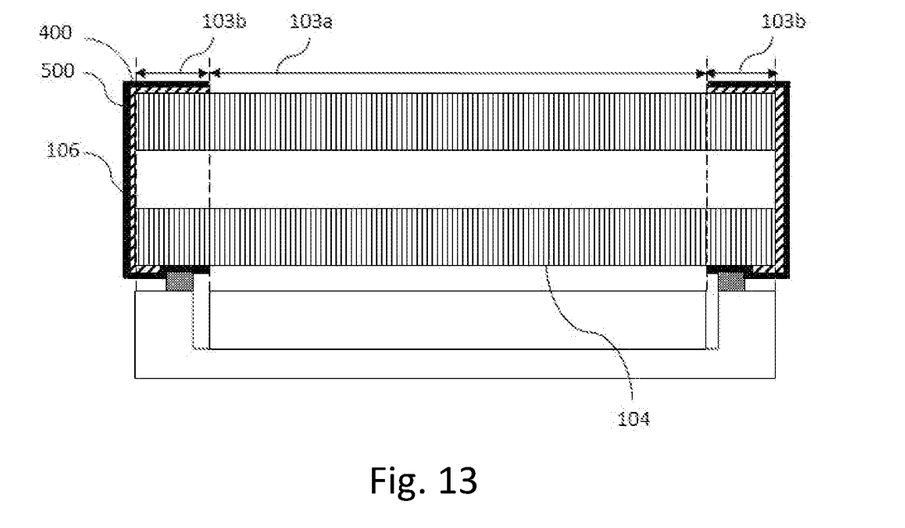

Refer to FIG. 12. In some embodiments, the insulating ink 400 is disposed on at least one sidewall 106 of the display unit 100 and extended to the display surface 102. The extension of the insulating ink 400 to the display surface 102 can prevent from that local screen blackening occurs in the boundary of the viewed area of the embedded touch panel display device 10. For example, in some In-Cell type touch-control display devices, the touch-control unit is disposed between the lower polarization film and the liquid crystal layer. It indicates that the level of the liquid crystal layer is higher than the level of the touch-control unit. Thus, expanding the extended portion of the insulating ink 400 can effectively prevent from the screen blackening phenomenon; the phenomenon is resulted from the electrostatic charges penetrating upward through the housing from the external side of the touch panel display device 10 and accumulating in the perimeter of the display unit 100. In some embodiments (not shown in the drawings), a portion of the first conductive ink 500 is disposed on the insulating ink 400, and another portion of the first conductive ink 500 is extended to the perimeter of the display surface 102 such as the boundary of the upper polarization film. Refer to FIG. 13. In some embodiments, a portion of the first conductive ink 500 is disposed on the insulating ink 400 and extended to a region of the insulating ink 400 extended to the display surface 102. Refer to FIG. 13 again. In some embodiments, the first conductive ink 500 is extended to: a region of the display surface 102 corresponding to the peripheral region 103b; a region of the non-display surface 104 corresponding to the peripheral region 103b; or extended to the abovementioned two regions. In the abovementioned configurations, suppose that the first conductive ink 500 is made of graphene or a carbon-containing material and thus has a low brightness, the first conductive ink 500 can improve the problem that light leaks from the sidewall 106 and the peripheral area 103b. Refer to FIG. 11 again. In some embodiments, when the first conductive ink 500 is extended to a region of the non-display surface 104 corresponding to the viewed region 103a, the first conductive ink 500 should be made of a transparent material.

Electrostatic discharge tests are performed on three sides of the touch panel display device 10 in the present invention and three sides of the conventional touch-control display device. As shown in Table. 1 for the results of the test, the touch panel display device 10 of the present invention has better anti-ESD capability within the electrostatic voltages of 8 kV-16 Kv. Thus, the present invention can effectively prevent from that the blackening screen phenomenon occur in the boundary of the display unit 100.

TABLE 1

| Tested Item | Tested Region | Electrostatic Voltage | |
|---|---|---|---|
| | | 2 kV~6 kV | 8 kV~16 kV |
| Prior Art | First Side | PASS | NG |
| | Second Side | PASS | NG |
| | Third Side | PASS | NG |

TABLE 1-continued

| Tested Item | Tested Region | Electrostatic Voltage | |
|---|---|---|---|
| | | 2 kV~6 kV | 8 kV~16 kV |
| The Present Invention | First Side | PASS | PASS |
| | Second Side | PASS | PASS |
| | Third Side | PASS | PASS |

What is claimed is:

1. An embedded touch panel display device, comprising
   a display unit, having a display surface and a non-display surface opposite to the display surface;
   a touch-control unit, disposed inside the display unit;
   a conductive frame, disposed on one side of the display unit and facing the non-display surface of the display unit;
   an insulating ink disposed on at least one sidewall of the display unit and extended to the non-display surface and a level equal to or lower than a level of the touch-control unit;
   a first conductive ink disposed on the at least one sidewall of the display unit and extended to the non-display surface, wherein at least a portion of the first conductive ink is disposed on the insulating ink;
   a second conductive ink disposed on the at least one sidewall of the display unit and extended to a level higher than a level of the touch-control unit; and
   a double-sided adhesive, disposed between the display unit and the conductive frame to secure the display unit and the conductive frame,
   wherein the first conductive ink and the conductive frame are electrically connected to each other to form an electrostatic discharge path.

2. The embedded touch panel display device according to claim 1, wherein the double-sided adhesive is made of a conductive material, and a portion of the double-sided adhesive is disposed on a region where the first conductive ink is disposed on the display unit, such that the electrostatic discharge path is formed by the first conductive ink, the double-sided adhesive, and the conductive frame.

3. The embedded touch panel display device according to claim 1, wherein the double-sided adhesive is made of a non-conductive material, and the first conductive ink extended to the non-display surface is further extended to the conductive frame and cooperates with the conductive frame to form the electrostatic discharge path.

4. The embedded touch panel display device according to claim 1, wherein the first conductive ink is disposed on the at least one sidewall of the display unit and extended to a level higher than a level of the touch-control unit.

5. The embedded touch panel display device according to claim 4, wherein a bare portion of the touch-control unit is revealed by the display unit, and at least one of the first conductive ink and the insulating ink is extended to the bare portion of the touch-control unit.

6. The embedded touch panel display device according to claim 4, wherein a bare portion of the display unit is revealed by the touch-control unit, at least one of the first conductive ink and the insulating ink is extended to the bare portion of the display unit.

7. The embedded touch panel display device according to claim 1, wherein the second conductive ink is extended to the first conductive ink and electrically connected with the first conductive ink.

8. The embedded touch panel display device according to claim 1, wherein a bare portion of the touch-control unit is revealed by the display unit, and the second conductive ink is extended to the bare portion of the touch-control unit.

9. The embedded touch panel display device according to claim 1, wherein a bare portion of the display unit is revealed by the touch-control unit, and the second conductive ink is extended to the bare portion of the display unit.

10. The embedded touch panel display device according to claim 1, wherein a portion of the first conductive ink is disposed on the insulating ink and extended to a region of the insulating ink that is extended to the display surface.

11. The embedded touch panel display device according to claim 1, wherein the display unit has a viewed area and a peripheral area surrounding the viewed area, and the first conductive ink is extended to a region of the display surface corresponding to the peripheral area.

12. The embedded touch panel display device according to claim 11, wherein the first conductive ink is selected from a group including graphene or carbon-containing materials.

13. The embedded touch panel display device according to claim 1, wherein the display unit has a viewed area and a peripheral area surrounding the viewed area, and the first conductive ink is extended to a region of the non-display surface corresponding to the peripheral area.

14. The embedded touch panel display device according to claim 13, wherein the first conductive ink is selected from a group including graphene or carbon-containing materials.

15. The embedded touch panel display device according to claim 1, wherein the display unit has a viewed area and a peripheral area surrounding the viewed area, and the first conductive ink is extended to a region of the non-display surface corresponding to the viewed area.

\* \* \* \* \*